US009612270B2

(12) United States Patent
Packard, III et al.

(10) Patent No.: US 9,612,270 B2
(45) Date of Patent: Apr. 4, 2017

(54) METERING CONTINUITY TESTER (71) Applicant: Cooper Technologies Company, Houston, TX (US)

(72) Inventors: Duan Earl Packard, III, Sherman, TX (US); Daniel Wayne Vosbrink, Edwardsville, IL (US); Joseph Lee Hughes, Sherman, TX (US)

(73) Assignee: COOPER TECHNOLOGIES COMPANY, Houston, TX (US)

( * ) Notice: Subject to any disclaimer, the term of this patent is extended or adjusted under 35 U.S.C. 154(b) by 69 days.

(21) Appl. No.: 14/643,352

(22) Filed: Mar. 10, 2015

(65) Prior Publication Data
US 2016/0266190 A1 Sep. 15, 2016

(51) Int. Cl.
*G01R 31/02* (2006.01)
*G01R 31/04* (2006.01)
*G01R 31/333* (2006.01)

(52) U.S. Cl.
CPC ....... *G01R 31/045* (2013.01); *G01R 31/3333* (2013.01)

(58) Field of Classification Search
CPC .. G01R 31/045; G01R 31/327; G01R 31/333; G01R 31/3333; G01R 1/067; G01R 1/0408
USPC .......................................................... 324/424
See application file for complete search history.

(56) References Cited

U.S. PATENT DOCUMENTS

| 4,327,396 A | * | 4/1982 | Schacht | H02B 1/305 |
| | | | | 361/648 |
| 4,491,790 A | * | 1/1985 | Miller | G01R 21/00 |
| | | | | 324/107 |
| 4,646,003 A | * | 2/1987 | Phillips | G01R 35/04 |
| | | | | 324/74 |
| 4,804,957 A | * | 2/1989 | Selph | G01R 21/00 |
| | | | | 340/870.03 |

(Continued)

FOREIGN PATENT DOCUMENTS

CN 2576978 Y 10/2003

OTHER PUBLICATIONS

S-120 Single Phase Socket Tester; Brooks Utility Products; http://www.brooksutility.com/products/115.

(Continued)

*Primary Examiner* — Hoai-An D Nguyen
*Assistant Examiner* — Sean Curtis
(74) *Attorney, Agent, or Firm* — Pearne & Gordon LLP (57) ABSTRACT

A testing device for a meter socket assembly, including breaker load lugs, includes a base unit having a plurality of test probes, a ground node, and a breaker node having a plurality of breaker probes. To perform the test, the base unit is inserted into a jaw meter socket such that each of the plurality of test probes are in contact with jaws of the jaw meter socket, at least two of the plurality of breaker probes are in contact with each of a plurality of breaker load lugs of a main breaker, and the breaker node is electrically connected to the base unit. The testing device determines the jaw type of the meter socket assembly and can output results of tests relating to phase to phase, phase to ground, crossed cables, and interruption of electrical paths. The testing device can output results of the test audibly and visually.

18 Claims, 8 Drawing Sheets

(56) References Cited

U.S. PATENT DOCUMENTS

| | | | | | |
|---|---|---|---|---|---|
| 5,361,026 | A | * | 11/1994 | Pruehs | G01R 35/00 324/133 |
| 5,590,179 | A | * | 12/1996 | Shincovich | G01D 4/004 340/870.03 |
| 6,141,626 | A | * | 10/2000 | Holdsclaw | G01R 22/00 324/76.11 |
| 6,520,798 | B1 | * | 2/2003 | Robinson | G01R 11/04 361/663 |
| 6,629,046 | B1 | * | 9/2003 | Bond | G01R 21/1333 702/61 |
| 6,663,405 | B1 | * | 12/2003 | Robinson | G01R 11/04 361/102 |
| 6,766,698 | B1 | * | 7/2004 | Robinson | G01L 5/0057 439/839 |
| 7,189,109 | B2 | * | 3/2007 | Robinson | G01R 22/066 439/517 |
| 7,639,000 | B2 | * | 12/2009 | Briese | G01D 3/08 324/142 |
| 7,688,060 | B2 | * | 3/2010 | Briese | G01D 3/08 324/142 |
| 7,688,061 | B2 | * | 3/2010 | Briese | G01D 3/08 324/142 |
| 7,800,890 | B1 | * | 9/2010 | Therrien | G01R 22/065 324/156 |
| 7,850,483 | B2 | * | 12/2010 | Siglock | H01R 33/94 439/517 |
| 7,852,064 | B1 | * | 12/2010 | Medina | G01R 11/04 324/108 |
| 7,999,532 | B2 | * | 8/2011 | Briese | G01D 3/08 324/142 |
| 8,177,580 | B2 | * | 5/2012 | Feldman | H01R 33/945 439/146 |
| 8,754,634 | B2 | * | 6/2014 | Chamarti | G01R 22/066 200/61.93 |
| 9,097,746 | B2 | * | 8/2015 | Ramirez | G01R 22/066 |
| 2002/0074990 | A1 | * | 6/2002 | Shincovich | H04B 3/54 324/110 |
| 2005/0212526 | A1 | * | 9/2005 | Blades | G01R 31/041 324/543 |
| 2011/0237118 | A1 | * | 9/2011 | Feldman | H01R 33/945 439/517 |
| 2013/0204450 | A1 | * | 8/2013 | Kagan | H04L 67/06 700/291 |
| 2013/0205022 | A1 | * | 8/2013 | Kagan | H04L 67/06 709/224 |
| 2014/0025321 | A1 | * | 1/2014 | Spanier | G01R 21/133 702/62 |
| 2014/0028323 | A1 | * | 1/2014 | McGuire | G01R 31/04 324/508 |
| 2015/0036267 | A1 | * | 2/2015 | Miller | H01H 9/54 361/625 |
| 2015/0310191 | A1 | * | 10/2015 | Koval | H04L 67/12 713/189 |
| 2015/0338446 | A1 | * | 11/2015 | Zhu | G01R 21/133 702/61 |
| 2016/0111230 | A1 | * | 4/2016 | Fonseca | H01H 9/0271 361/93.6 |
| 2016/0266190 | A1 | * | 9/2016 | Packard, III | G01R 31/3333 |
| 2016/0320427 | A1 | * | 11/2016 | Bautista | H01R 31/06 |

OTHER PUBLICATIONS

P-277 Polyphase Socket Tester; Brooks Utility Products; http://www.brooksutility.com/products/116.

Indicative Socket Testers (Voltage Indicating Socket Tester); Brooks Utility Products; http://www.brooksutility.com/products/117.

Indicative Socket Testers (Load Indicating Socket Tester); Brooks Utility Products; http://www.brooksutility.com/products/118.

Indicative Socket Testers (Voltage and Load Indicating Socket Tester); Brooks Utility Products; http://www.brooksutility.com/products/119.

* cited by examiner

```
Meter: 4 Jaw
PASS
```

Figure 10

```
Meter: 7 Jaw
FAIL: C Load
```

METERING CONTINUITY TESTER

FIELD AND BACKGROUND OF THE INVENTION

The present application is directed to an electrical testing device and method and, more particularly, to an electrical testing device and method for a meter socket and main breaker.

Current quality checking of meter socket assemblies with a main breaker requires visually tracing wires and inspecting the assembly for quality issues. Such methods, however, cannot detect if a main breaker is defective or broken. Additionally, automated devices are unable to adapt to various breaker configurations by automatically determining the jaw type of the meter socket assembly and adjusting the tests accordingly.

BRIEF SUMMARY OF THE INVENTION

According to one example of the invention described herein, a testing device comprises a base unit having a plurality of test probes; and a breaker node having a plurality of breaker probes, wherein the base unit is inserted into a jaw meter socket such that the plurality of test probes are in contact with jaws of the jaw meter socket, at least two of the plurality of breaker probes are in contact with corresponding breaker load lugs of a main breaker, and the breaker node is electrically connected to the base unit.

In various embodiments of the above example, the testing device further comprises a ground node, wherein the ground node is electrically connected to an electrical ground or neutral, and is electrically connected to the base unit; the testing device further comprises a processor configured to: perform a test on the jaw meter socket with the main breaker; and output a result of the test; the processor is further configured to visually output a result of the test to a display of the testing device; the processor is further configured to audibly output a result of the test via beep codes from a speaker; the test is one of a phase to phase, phase to ground, crossed cables, and interruption of electrical paths tests; the processor is further configured to: automatically detect the type of meter socket; perform the test according to the detected type of meter socket; and visually output the detected type of meter socket on a display of the testing device, wherein the meter socket is one of a 4 jaw, 5 jaw, and 7 jaw; at least one of the plurality of breaker probes has a brush for interfacing with a load lug of the main breaker; and/or a spacing between the plurality of breaker probes is adjustable.

According to another example of the invention described herein, a testing method comprises placing a base unit of a testing device on a jaw meter socket such that test probes of the base unit are in contact with jaws of the jaw meter socket; inserting a breaker node of the testing device into a main breaker such that breaker probes of the breaker node are in contact with breaker load lugs of the main breaker; detecting a type of the jaw meter socket; and performing a test on the jaw meter socket with the main breaker according to the detected type of meter socket, wherein the breaker node is electrically connected to the base unit.

In various embodiments of the above example, the testing method further comprises electrically connecting a ground node to an electrical ground or neutral, wherein the ground node is electrically also connected to the base unit of the testing device; the testing method further comprises visually outputting a result of the test to a display of the testing device; the testing method further comprises visually outputting the detected type of meter socket on a display of the testing device; the testing method further comprises audibly outputting a result of the test via beep codes from a speaker; the test is one of a phase to phase, phase to ground, crossed cables, and interruption of electrical paths tests; the meter socket is one of a 4 jaw, 5 jaw, and 7 jaw; at least one of the plurality of breaker probes has a brush for interfacing with a load lug of the main breaker; and/or a spacing of the breaker probes is adjusted before inserting the breaker node of the testing device into the main breaker.

DETAILED DESCRIPTION OF THE INVENTION

Certain terminology is used herein for convenience only and is not to be taken as a limitation on the present invention. Relative language used herein is best understood with reference to the drawings, in which like numerals are used to identify like or similar items. Further, in the drawings, certain features may be shown in somewhat schematic form.

The testing device described herein is a device for detecting the presence of electrical faults in a 4, 5 or 7 jaw meter socket assembly with a main breaker representing 1Ø3W, 3Ø3W and 3Ø4W systems. In a general sense, by sending signals from a base unit through the meter assembly to receiving modules, the testing device can automatically determine the jaw type of the meter socket and detect errors. For example, such errors may be related to phase to phase, phase to ground, crossed cables, and interruption of electrical paths.

Figure 12:
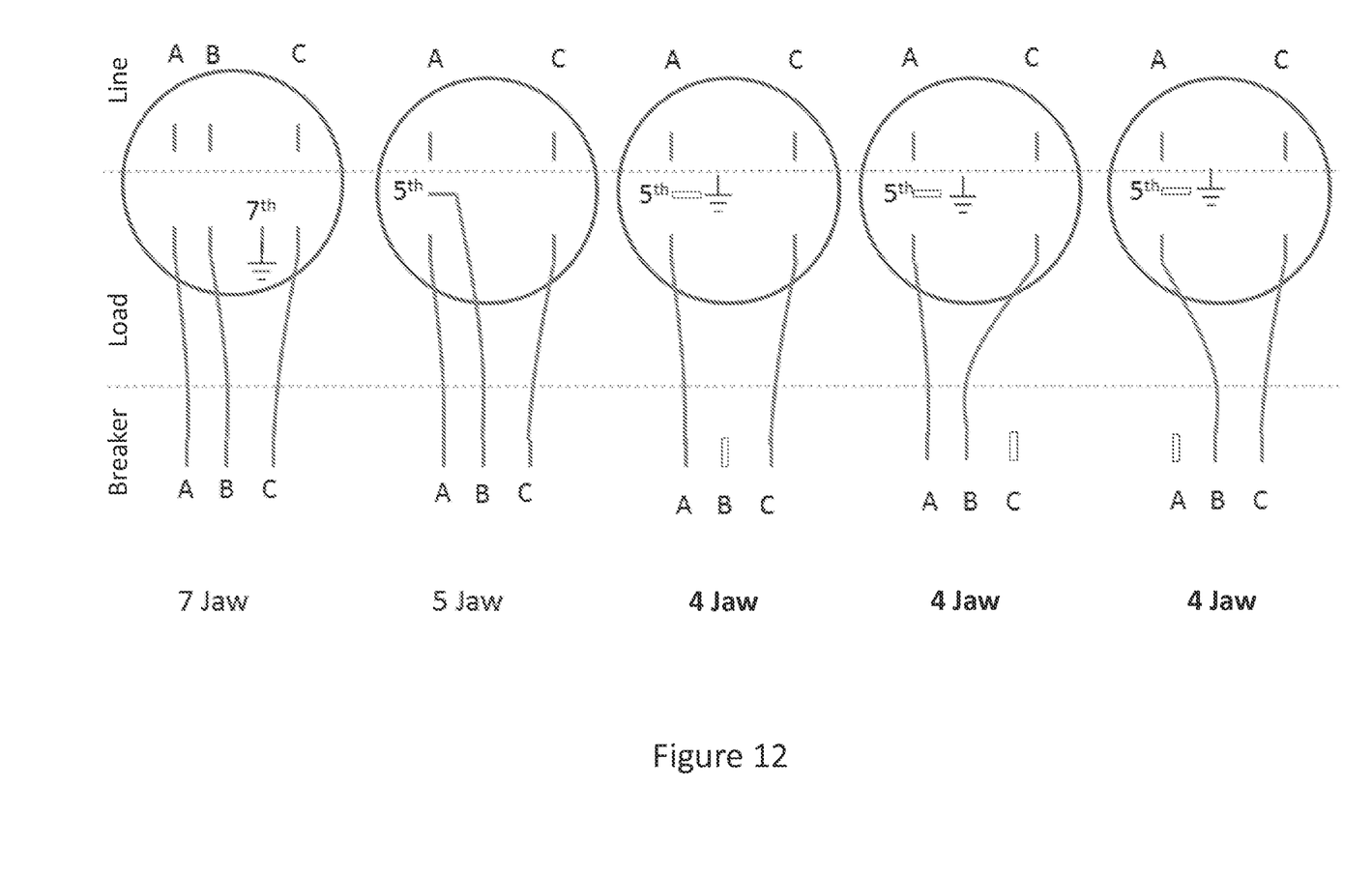
FIG. 12 illustrates various meter jaws and breaker interfaces.

With reference to FIG. 12, the various meter jaw types and breaker interfaces are described. A "7 Jaw" is a meter socket with 7 total jaws (3Ø4W) where the 7th jaw is grounded and the breaker has 3 poles. A "5 Jaw" is a meter socket with 5 total jaws (3Ø3W), where the 5th jaw runs to B phase and the breaker has 3 poles. Lastly, a "4 Jaw" is a meter socket with 4 jaws (1Ø3W), which may have a 5th jaw that runs to ground, and the breaker has 2 poles, connecting to the A & C, A & B, or B & C phases.

Figure 1:
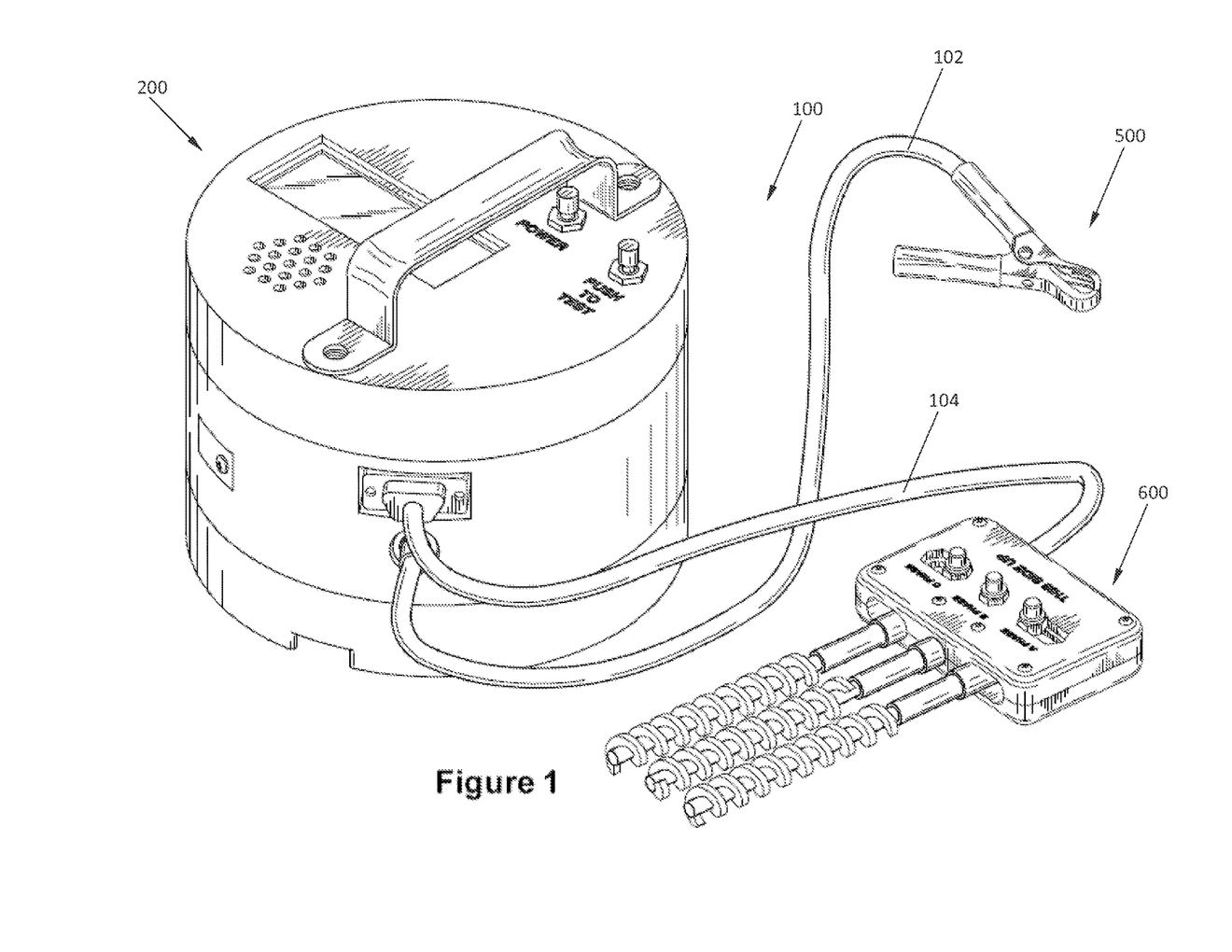
FIG. 1 is a perspective view of an example testing device.

Turning now to a description of the figures of the testing device, FIG. 1 illustrates a perspective view of an example testing device 100 including a base unit 200, ground node 500, and breaker node 600. A first aspect of the testing device described herein relates to the base unit 200. The base unit 200 is generally understood as the main unit of the device 100 from which tests are run. The base unit 200 includes buttons and a display for testing as well as ports for connecting the ancillary nodes. During operation, the base 200 unit sits on a meter socket of an assembly being tested. A second aspect of the testing device described herein is the ground node 500. The ground node electrically connects (e.g., clamps) to a ground or bonded neutral in the assembly being tested and can send and receive signals from the base unit 200. A third aspect of the testing device described herein is the breaker node 600. The breaker node 600 interfaces with the circuit breaker in the assembly being tested and sends and receives signals from the base unit 200. Cables 102, 104 can be used to connect the ground node 500 and breaker node 600 to the base unit 200 for transmitting and receiving signals to and from the base unit 200.

Figure 2:
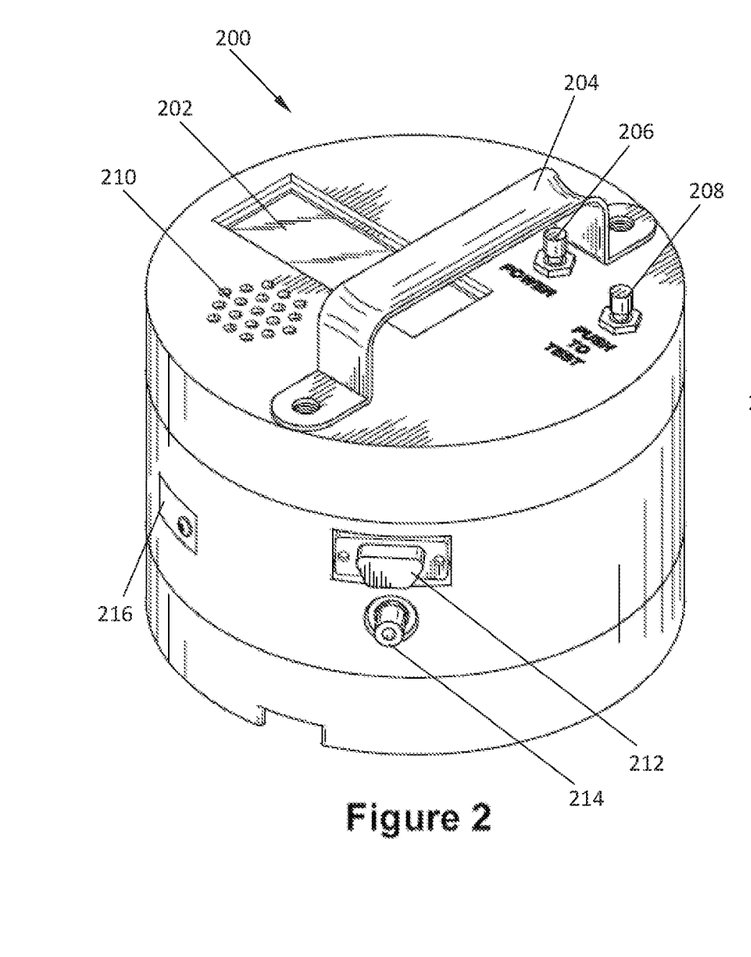
FIG. 2 is a perspective view of the top of an example base unit of a testing device.
Figure 3:
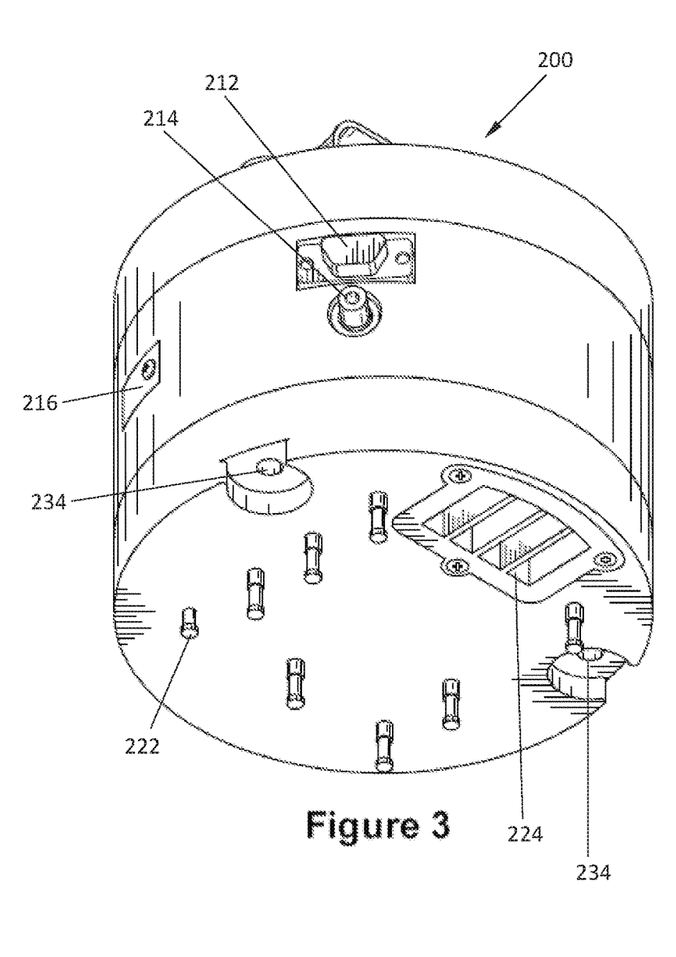
FIG. 3 is a perspective view of the bottom of an example base unit of a testing device.
Figure 4:
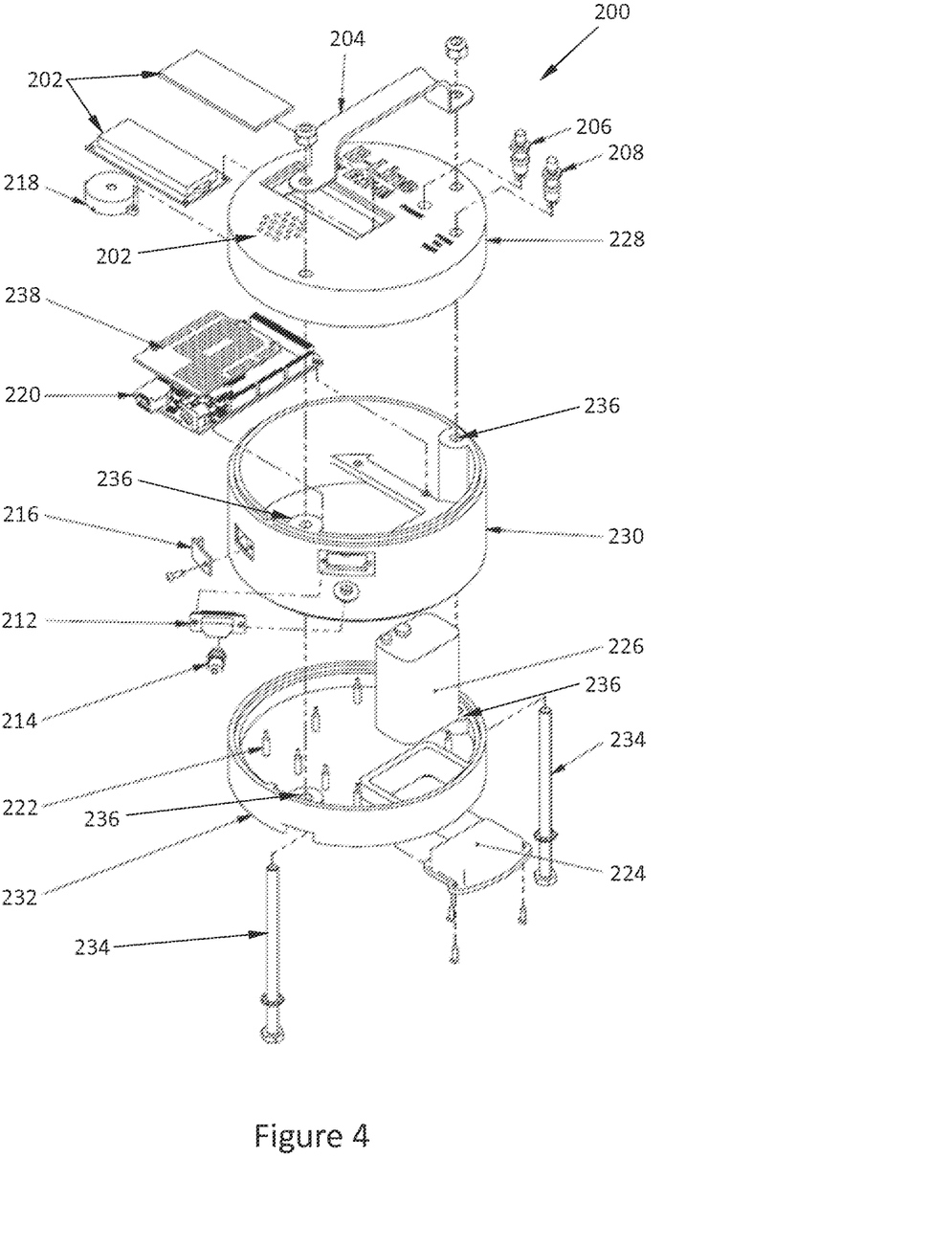
FIG. 4 is an exploded view of an example base unit of a testing device.

With respect to the first aspect of the testing device, FIGS. 2 and 3 illustrate perspective views of the top and bottom of the base unit 200, and FIG. 4 illustrates an exploded view of the base unit 200. As illustrated in FIGS. 2 and 4, the base unit can have a display 202, for example, a liquid crystal display (LCD) or light emitting diode (LED) display. The display 202 may be used to indicate a ready status, testing, pass/fail, errors, and the like to the user. The base unit 200 may also have a carrying handle 204 for holding and/or transporting the base unit 200. A power button 206 on the base unit 200 can be used to turn on and off the base unit 200 manually. In some embodiments, the base unit 200 may automatically turn off after a predetermined period of time, for example, after 1 minute 40 seconds of being idle. A test switch such as a push button 208 is employed to activate testing of the meter socket. A speaker grill 210 allows sound to be output to the user for indicating test results, and protects a speaker 218 located inside the base unit 200.

As further illustrated in FIGS. 2-4, the base unit 200 may have a breaker node cable port 212 and a ground node cable port 214 for attaching the breaker node 600 and the ground node 500, respectively, via cables 102, 104. A USB interface door 216 can provide access to a USB port 220 for programming a microcontroller, processor, memory, storage devices, or similar controls and electronics of the testing device. As illustrated in FIGS. 3 and 4, the base unit 200 has a plurality of test probes 222 for interfacing with the meter socket assembly. The base unit 200 may also have a battery access door 224 for accessing a battery holder 226.

The base unit 200 can serve as a housing for microcontrollers, processors, memory, storage devices, and other electronics used by the testing device 100. For example, as illustrated in more detail in FIG. 4, the base unit 200 has an upper body section 228, middle body section 230, and lower body section 232. Two bolts 234 pass through bolt holes 236 in each section to secure the upper 228, middle 230, and lower 232 body sections together. The bolts 234 may also pass through holes on opposite sides of the carrying handle 204 to secure the carrying handle 204 to the upper body section 228.

A circuit board and other electronics 238 can be secured in the middle body section 230. The circuit board and electronics 238 are electrically connected to the display 202, which is secured underneath the upper body section 228 such that the display 202 may be seen through an upper surface of the upper body section 228. The circuit board and electronics 238 are also electrically connected to the power and test buttons 206, 208, which are secured through the upper surface of the of the upper body section 228. The circuit board and electronics 238 are also electrically connected to the breaker node port 212, ground node port 214, and USB port 220, which are accessible through openings in a side surface of the middle body section 230. The breaker node port 212, ground node port 214, and USB interface door 216 may be secured via a screw or bolt to the middle body section 230. The test probes 222 may be secured through a bottom surface of the lower body section 232, for example, with bolts or screws, and provide an electrical connection to the circuit board and electronics 238.

The circuit board and electronics 238 are also electrically connected to the battery holder 226. The battery holder 226 is secured between the lower 232 and middle 230 sections of the base unit 200. The battery holder 226 facilitates securing a battery or batteries in the base unit 200 and providing an electrical connection between the battery and the circuit board and electronics 238. The bottom surface of the lower body section 232 may have an opening 240 to provide access to the battery holder 226. The battery access door 224 may be secured to the lower surface, for example with screws or bolts, to cover the opening 240. The battery holder 226 may hold any number or types of batteries. For example, the battery holder may hold six AA batteries, or a single 9V battery. In still other embodiments, it is envisioned that the testing device 100 could be powered by AC or DC, for example, provided from a wall outlet. To replace the batteries, the battery access door 224 can be removed (e.g., by removing screws securing the battery access door to the lower surface of the base unit), allowing access to the battery holder. After the batteries are replaced, the battery access door 224 may be re-secured to the base unit 200.

It is noted that the inclusion of each of the above elements is not intended to be limiting. Rather, various elements, and variations thereof, may be added or subtracted to the base unit 200, including those not described herein.

Figure 5:
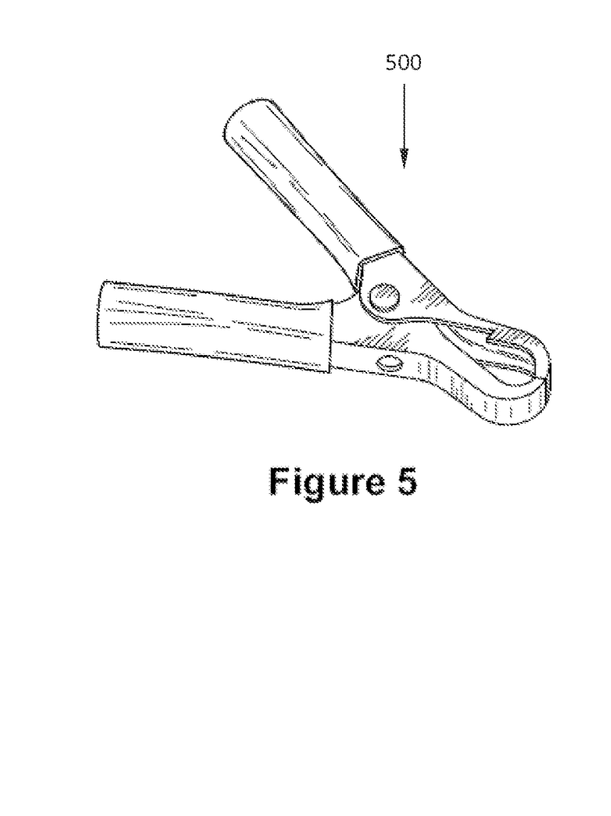
FIG. 5 is a perspective view of an example ground node of a testing device.

With respect to the second aspect of the testing device described herein, FIG. 5 illustrates a perspective view of a ground node 500. The ground node can be in the form of a spring loaded clamp, as shown, such as a mechanical jaw that is opened to attach to the ground or bonded neutral in a metering enclosure. The ground node 500 can also have a cable connection (not shown) for affixing a cable to the clamp, the cable being used to connect the ground node 500 to the base unit 200. In other embodiments, the ground node 500 can be in the form of a probe, jaw, or the like that allows the base unit 200 to be electrically connected to a ground or neutral.

Figure 6:
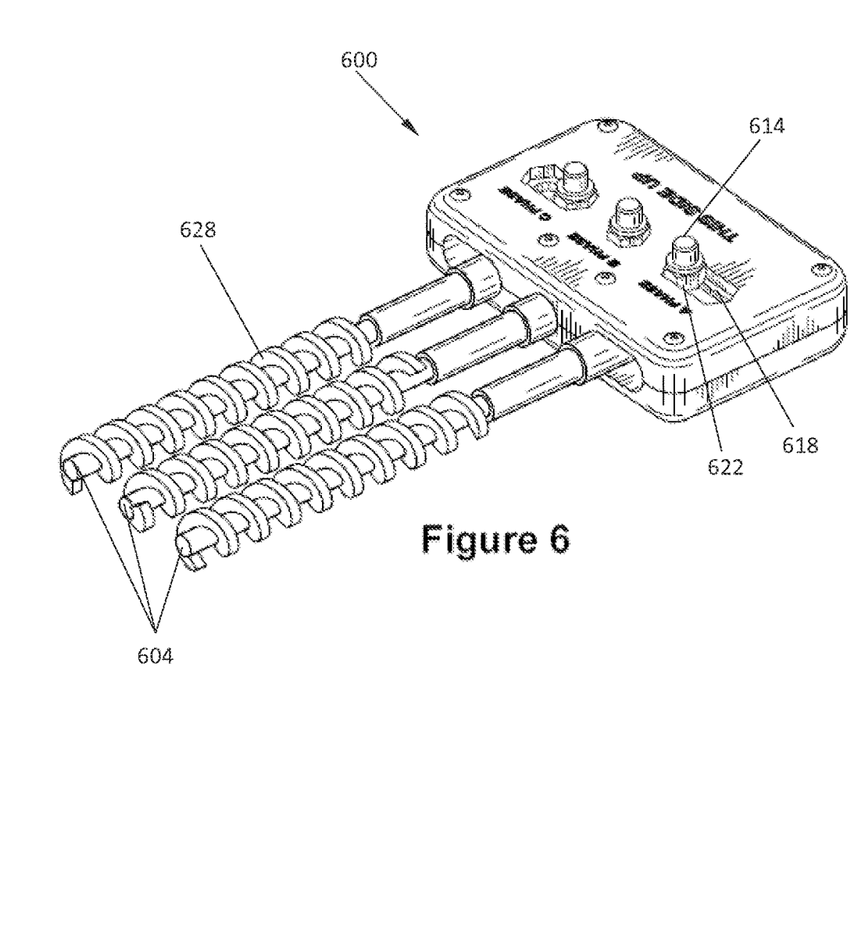
FIG. 6 is a perspective view of an example breaker node of a testing device.
Figure 7:
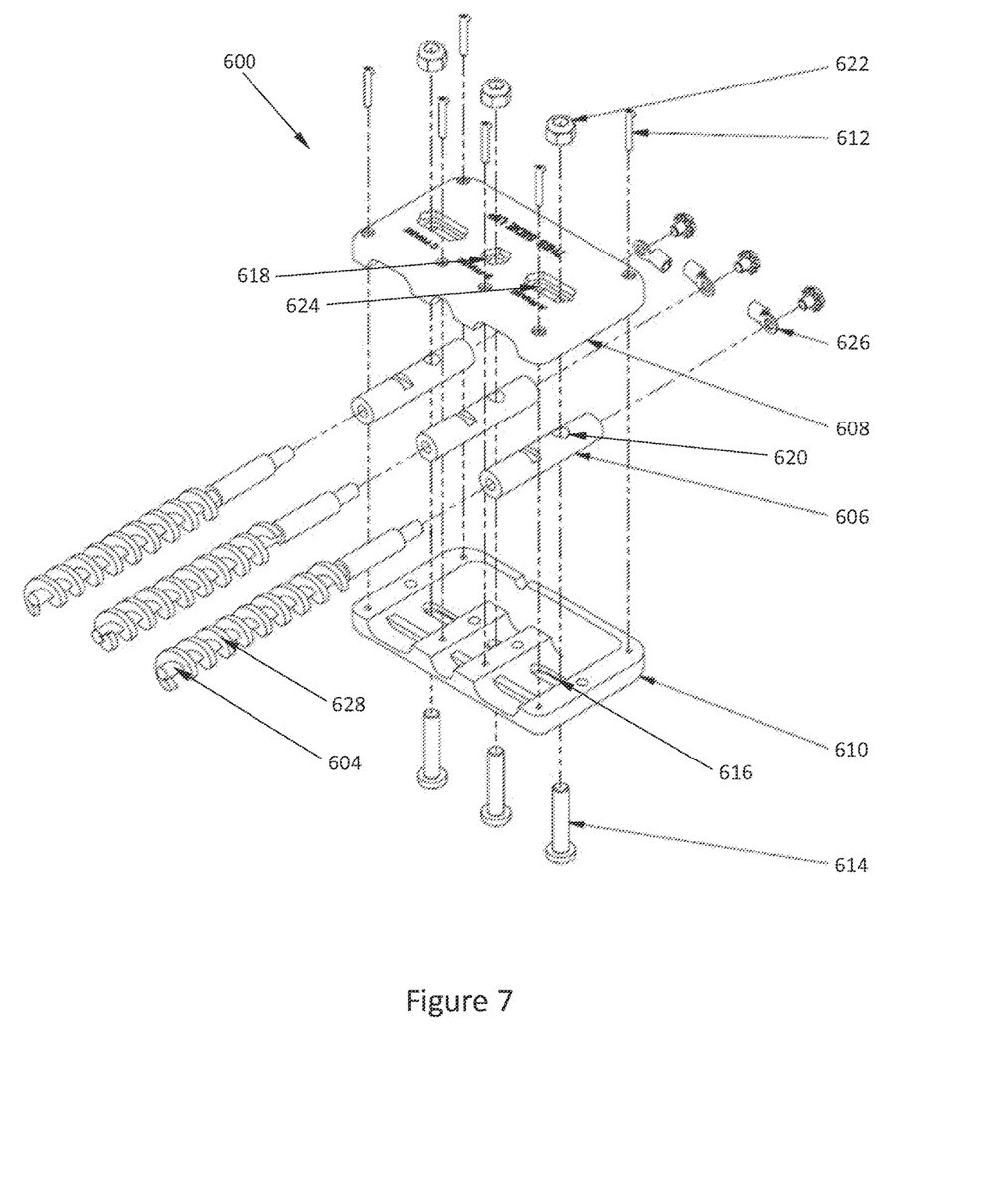
FIG. 7 is an exploded view of an example breaker node of a testing device.

With respect to the third aspect, FIGS. 6 and 7 illustrate a perspective view and an exploded view, respectively, of a breaker node 600. The breaker node 600 includes a breaker housing 602 and a plurality of breaker probes 604, for example, corresponding to A, B, and C phases. Like the ground node 500, the breaker node 600 has a cable connection (as demonstrated in FIG. 1) for affixing a cable to the breaker node 600, wherein the cable connects the breaker node 600 to the base unit 200. FIG. 1 illustrates the cable connection from a rear side of the breaker housing 602 to the base unit 200. Referring to FIGS. 6 and 7, the breaker probes 604 are at least partially covered by a helical brush 628, which interfaces with a circuit breaker load lug (not shown). The breaker probes 604 are attached to the breaker housing 602 by threading the breaker probes 604 into a breaker probe holder 606.

As further illustrated in FIG. 7, the breaker node housing 602 has an upper section 608 and a lower section 610. The upper and lower sections 608, 610 may be secured together with bolts, screws, and/or the like 612. The lower section 610 is formed to seat at least one (e.g., three) breaker probe holders 606. The breaker probes 604 can each be individually secured to the breaker probe holders 606 with threads such as by screwing a breaker probe 604 into a breaker probe holder 606. To replace the breaker probes 604, a breaker probe 604 may be unscrewed from the corresponding breaker probe holder 606 until it is removed. A new breaker probe 604 can then be screwed into the breaker probe holder 606.

For each of the breaker probe holders 606, a bolt 614 is inserted through an opening 616, 618 in either the upper 608 or lower section 610, through a hole 620 in the breaker probe holder 606, and through a corresponding opening 616, 618 in the other of the upper 608 or lower 610 sections. A nut 622 secures the bolt 614, which thereby secures the breaker probe holder 606 between the upper 608 and the lower 610 sections of the breaker node housing 602. In some embodiments, the openings 616, 618 in the upper and lower sections may be elongated. For example, as shown in FIG. 7, the openings 616, 618 corresponding to the outer breaker probes are elongated while the openings 624 for the center breaker probe are substantially circular. Electrical contacts 626 may be secured to the breaker probe holders 606 for providing an electrical connection between the breaker probes 604 and a cable connecting the breaker node 600 to the base unit 200.

Figure 8:
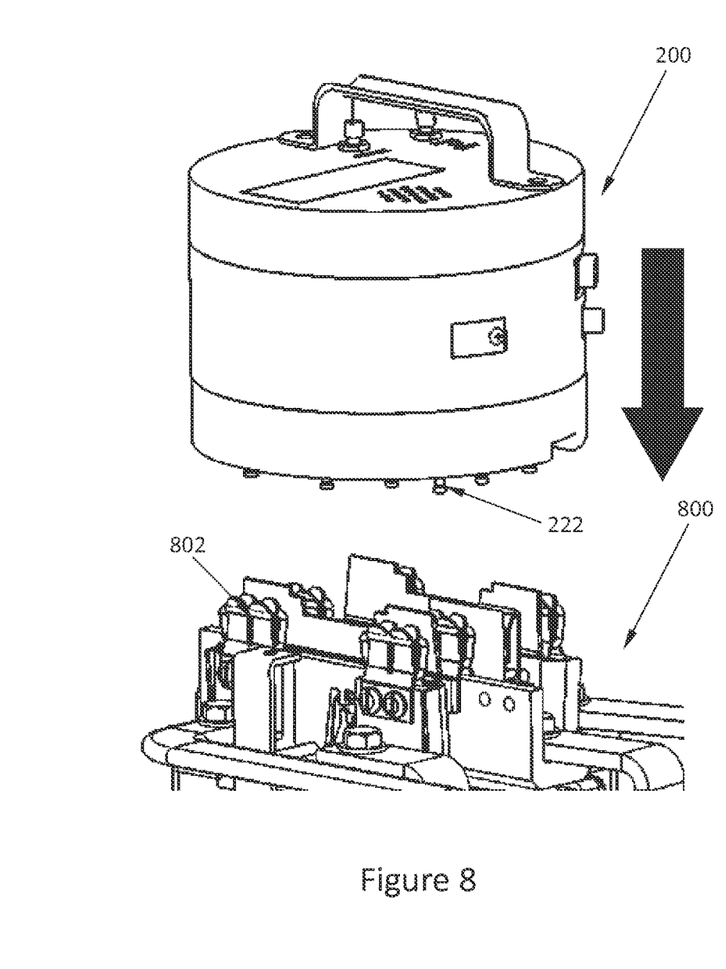
FIG. 8 is a perspective view of an example base unit being inserted into jaws of a meter socket.
Figure 9:
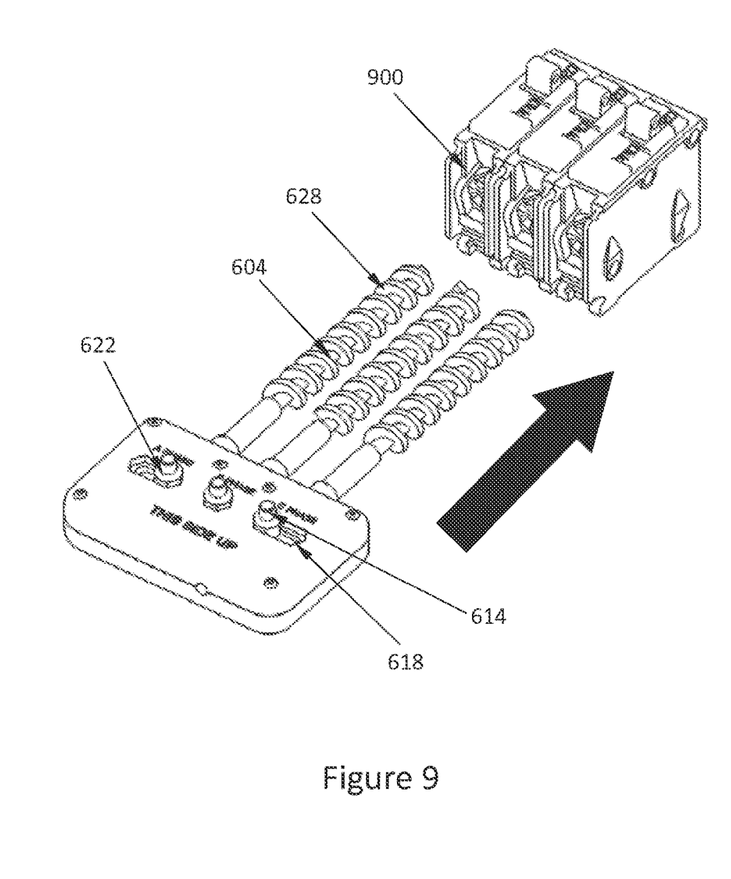
FIG. 9 is a perspective view of an example breaker node being inserted into a breaker load lug.

To use the testing device 100, the ground node 500 and breaker node 600 are plugged into their respective ports 214, 212 on the base unit 200. As illustrated in FIG. 8, the base unit 200 is placed on top of the meter socket 800 such that the test probes 222 are in contact with the jaws 802 of the meter socket 800. The ground node 500 is electrically connected to a ground. For example, the ground node 500 may be clamped onto a neutral that is a bonded or grounded screw in the enclosure of the meter socket 800 assembly. As illustrated in FIG. 9, the breaker probes 604 are inserted into breaker load lugs 900 so that each affected brush 628 makes contact with each affected lug 900.

The spacing of the breaker probes 604 may be adjusted to match the spacing of the breaker load lugs 900. To adjust the spacing, the nut 622 for bolt 614 securing the breaker probe holder 606 (corresponding to the breaker probe 604 to be adjusted) may be loosened, and the breaker probe 604/breaker probe holder 606 assembly may be moved along the length of the corresponding elongated opening 618. According to another embodiment, nut 622 is a nylon lock nut. This allows the nut 622 to be tightened to a certain point without clamping down on the breaker node housing 602. In this way, the breaker probes 604 are free to move with the nut 622 tightened in place.

When the proper spacing is achieved, the nut 622 and bolt 614 may be tightened to re-secure the breaker probe 604 and breaker probe holder 606. While FIGS. 1, 6, and 7 illustrate only the outer breaker probes as adjustable, it is to be understood that any number of breaker probes may be adjusted in various embodiments. It is also to be noted that for single phase (2 pole) breakers, only 2 of the 3 breaker probes 604 will align with a breaker load lug 900. That is, either A-B, B-C or A-C phases will align. The non-aligning breaker probe(s) 604 may be removed as discussed above, by unscrewing the breaker probe 604 from the breaker probe holder 606, so that it is not in the way when the remaining breaker probes 604 are inserted into the breaker load lugs 900. However, in other embodiments, it is possible to leave the non-aligning breaker probe(s) 604 in place without affecting the function or alignment of the correctly-aligned breaker probe(s) 604.

The test may be run by turning on the testing device 100 by pressing the power button 206 and then pressing the test button 208. When the testing device powers on, the display 210 may light up and read, for example, "READY" to indicate that the testing device is ready to begin a test. When the test button 208 is pressed, the testing process is activated. The display 210 may then read, for example, "WORKING" as the test is running When the test is complete, the speaker 218 may sound a beep code or speech audio according to a pass/fail code and the display can show a more detailed pass/fail message.

Figure 10:
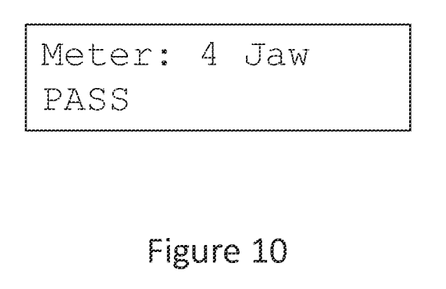
FIG. 10 illustrates an example display for a passing test.
Figure 11:
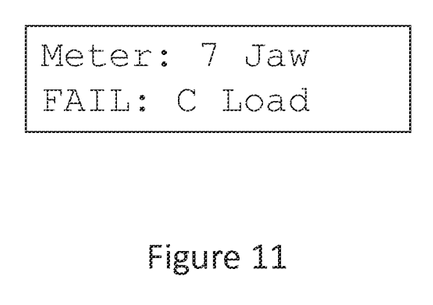
FIG. 11 illustrates an example display for a failing test.

The test codes can let the user know of the test results in at least two ways. First, an audible tone or speech audio can be used to indicate a passed or failed test. For example, a passing test could be indicated by a single, long hi-pitched beep, while a failing test could be indicated by a series of 3 short, hi-pitched beeps, repeated three times. Second, the display 210 may provide visual feedback for the user. For example, the display 210 may indicate the jaw type of the meter and break down the test by the following characteristics: line, load and breaker interface. As illustrated in FIGS. 10 and 11, the display 210 may have 2 lines—the top line showing the detected meter type (4 Jaw, 5 Jaw or 7 Jaw) and the bottom line indicating if the test passed (FIG. 10) or failed with the failure type (FIG. 11).

As noted above, the testing device detects at least one of phase to phase failures, phase to ground failures, crossed cables, and interruption of electrical paths. Failure codes relating to these tests may be provided, for example, in accordance with the below table:

| Error Code Relating To: | Example Issue |
| --- | --- |
| Connection | The Base Unit may not be seated correctly on the meter socket. |
| | The Breaker Node may not be making contact with the circuit breaker poles. |
| | Circuit breaker may not be in the "ON" position. |
| | Path from the meter socket load jaws to the Breaker Node on all phases may be interrupted. |
| A-Line | Path starting from the line side of the A phase jaw on the meter socket to the line lug may be making contact with a B or C phase entity or to a grounded part. |
| B-Line | Path starting from the line side of the B phase jaw on the meter socket to the line lug may be making contact with a C phase entity or to a grounded part. |
| C-Line | Path starting from the line side of the C phase jaw on the meter socket to the line lug may be making contact with a grounded part. |

-continued

| Error Code Relating To: | Example Issue |
| --- | --- |
| A-Load | Path starting from the load side of the A phase jaw on the meter socket to the breaker node may be making contact with a B or C phase entity or to a grounded part.<br>Path starting from the load side of the A phase jaw on the meter socket to the breaker node may be terminating on a different phase. |
| B-Load | Path starting from the load side of the B phase jaw on the meter socket to the breaker node may be making contact with a C phase entity or to a grounded part.<br>Path starting from the load side of the B phase jaw on the meter socket to the breaker node may be terminating on a different phase. |
| C-Load | Path starting from the load side of the C phase jaw on the meter socket to the breaker node may be making contact to a grounded part. |
| 5th Jaw | Path starting from the load side of the 5th jaw on the meter socket to the breaker node may be making contact with a C phase entity or to a grounded part.<br>Path starting from the load side of the 5th jaw on the meter socket to the breaker node may be terminating on a different phase. |
| Ground | Any one of the paths from the line jaws or load jaws may be making contact to a grounded part. |

It is noted that the above tests performed by the testing device may be implemented via hardware or software. For example, the tests may be implemented on a processor or a plurality of processors, and other electrical circuitry. These processors also may be embedded or integrated with other processors designed for a separate purpose, for example, as part of a central processing unit (CPU). A "processor" as used herein refers to any, or part of any, electrical circuit comprised of any number of electrical components, including, for example, resistors, transistors, capacitors, inductors, and the like. The circuit may be of any form, including, for example, an integrated circuit, a set of integrated circuits, a microcontroller, a microprocessor, a collection of discrete electronic components on a printed circuit board (PCB) or the like. The processor may also stand alone or be part of a computer used for operations other than processing image data. Implementation of these aspects may by hardware or software may be realized in any number of electronic devices and/or applications, including but not limited to, personal computers, servers, mobile phones, and the like. Moreover, the above aspects and/or combination of aspects may be stored in memory which is executable by one of said processors.

It should be noted that the above description is non-limiting, and the examples are but only a few of many possible processors and implementations envisioned.

It is also to be noted that the phrase "at least one of", as used herein, followed by a plurality of members means one of the members, or a combination of more than one of the members. For example, the phrase "at least one of a first widget and a second widget" means in the present application: the first widget, the second widget, or the first widget and the second widget. In addition, the term "substantially" is a term of estimation.

While various features are presented above, it should be understood that the features may be used singly or in any combination thereof. Further, it should be understood that variations and modifications may occur to those skilled in the art to which the claimed examples pertain. The examples described herein are exemplary. The disclosure may enable those skilled in the art to make and use alternative designs having alternative elements that likewise correspond to the elements recited in the claims. The intended scope may thus include other examples that do not differ or that insubstantially differ from the literal language of the claims. The scope of the disclosure is accordingly defined as set forth in the appended claims.

What is claimed is:

1. A testing device comprising:
a base unit having a plurality of test probes; and
a breaker node having a plurality of breaker probes, wherein
the base unit is inserted into a jaw meter socket such that the plurality of test probes are in contact with jaws of the jaw meter socket,
at least two of the plurality of breaker probes are in contact with corresponding breaker load lugs of a main breaker, and
the breaker node is electrically connected to the base unit through the meter socket and main breaker, and through a cable external to the meter socket and main breaker.

2. The testing device according to claim 1, further comprising a ground node, wherein the ground node is electrically connected to an electrical ground or neutral, and is electrically connected to the base unit.

3. The testing device according to claim 1, further comprising a processor configured to:
perform a test on the jaw meter socket with the main breaker; and
output a result of the test.

4. The testing device according to claim 3, wherein the processor is further configured to visually output a result of the test to a display of the testing device.

5. The testing device according to claim 3, wherein the processor is further configured to audibly output a result of the test via beep codes from a speaker.

6. The testing device according to claim 3, wherein the test is one of a phase to phase, phase to ground, crossed cables, and interruption of electrical paths tests.

7. The testing device according to claim 3, wherein the processor is further configured to:
automatically detect the type of meter socket;
perform the test according to the detected type of meter socket; and
visually output the detected type of meter socket on a display of the testing device,
wherein the meter socket is one of a 4 jaw, 5 jaw, and 7 jaw.

8. The testing device according to claim 1, wherein at least one of the plurality of breaker probes has a brush for interfacing with a load lug of the main breaker.

9. The testing device according to claim 1, wherein a spacing between the plurality of breaker probes is adjustable.

10. A testing method comprising:
placing a base unit of a testing device on a jaw meter socket such that test probes of the base unit are in contact with jaws of the jaw meter socket;
inserting a breaker probes of a breaker node of the testing device into a main breaker such that the breaker probes are in contact with breaker load lugs of the main breaker;
detecting a type of the jaw meter socket; and
performing a test on the jaw meter socket with the main breaker according to the detected type of meter socket, wherein the breaker node is electrically connected to the base unit.

11. The testing method according to claim 10, further comprising electrically connecting a ground node to an electrical ground or neutral, wherein the ground node is electrically also connected to the base unit of the testing device.

12. The testing device according to claim 10, further comprising visually outputting a result of the test to a display of the testing device.

13. The testing method according to claim 10, further comprising visually outputting the detected type of meter socket on a display of the testing device.

14. The testing method according to claim 10, further comprising audibly outputting a result of the test via beep codes from a speaker.

15. The testing method according to claim 10, wherein the test is one of a phase to phase, phase to ground, crossed cables, and interruption of electrical paths tests.

16. The testing method according to claim 10, wherein the meter socket is one of a 4 jaw, 5 jaw, and 7 jaw.

17. The testing method according to claim 10, wherein at least one of the plurality of breaker probes has a brush for interfacing with a load lug of the main breaker.

18. The testing method according to claim 10, wherein a spacing of the breaker probes is adjusted before inserting the breaker node of the testing device into the main breaker.

* * * * *